United States Patent
Polak et al.

(10) Patent No.: US 12,066,513 B2
(45) Date of Patent: Aug. 20, 2024

(54) SCOUT ACQUISITION ENABLES RAPID MOTION ESTIMATION AND REDUCTION (SAMER) SYSTEMS AND METHODS FOR RETROSPECTIVE MOTION MITIGATION

(71) Applicants: Siemens Healthcare GmbH, Erlangen (DE); The General Hospital Corporation, Boston, MA (US)

(72) Inventors: Daniel Polak, Blankenbach (DE); Stephen Farman Cauley, Somerville, MA (US); Kawin Setsompop, Charlestown, MA (US)

(73) Assignees: The General Hospital Corporation, Boston, MA (US); Siemens Healthineers AG, Erlangen (DE)

( * ) Notice: Subject to any disclaimer, the term of this patent is extended or adjusted under 35 U.S.C. 154(b) by 542 days.

(21) Appl. No.: 17/239,161

(22) Filed: Apr. 23, 2021

(65) Prior Publication Data
US 2021/0373105 A1    Dec. 2, 2021

Related U.S. Application Data

(60) Provisional application No. 63/031,760, filed on May 29, 2020.

(51) Int. Cl.
*G01R 33/54* (2006.01)
*G01R 33/48* (2006.01)
*G01R 33/56* (2006.01)

(52) U.S. Cl.
CPC ....... *G01R 33/543* (2013.01); *G01R 33/4818* (2013.01); *G01R 33/5608* (2013.01)

(58) Field of Classification Search
CPC .................. G01R 33/543; G01R 33/56509
See application file for complete search history.

(56) References Cited

U.S. PATENT DOCUMENTS 5,613,492 A * 3/1997 Feinberg .......... G01R 33/56509
                                                                                    324/309
6,442,290 B1 * 8/2002 Ellis ..................... H04N 1/04
                                                                                    711/200

(Continued)

FOREIGN PATENT DOCUMENTS

EP          3581109 A1    12/2019
WO     2017092973 A1     6/2017

OTHER PUBLICATIONS

Larkman, David J., et al. "Use of Multicoil Arrays for Separation of Signal from Multiple Slices Simultaneously Excited", Journal of Magnetic Resonance Imaging, vol. 13, pp. 313-317; 2001.

(Continued)

*Primary Examiner* — Oommen Jacob
(74) *Attorney, Agent, or Firm* — Banner & Witcoff Ltd.

(57) ABSTRACT

In a method and system for reducing motion artifacts in magnetic resonance image data, a scout scan of the region of the patient is performed, a magnetic resonance (MR) measurement of the region of the patient is performed to acquire MR image data of the region of the patient, and motion correction is performed on the acquired MR image data based on the scout scan to generate corrected MR image data. The motion correction technique advantageously reduces an influence of a patient motion on the magnetic resonance image data.

17 Claims, 11 Drawing Sheets

(56) References Cited

U.S. PATENT DOCUMENTS

| | | | | |
|---|---|---|---|---|
| 2003/0092983 | A1* | 5/2003 | Baker | A61B 6/541 600/428 |
| 2005/0113671 | A1* | 5/2005 | Salla | G01R 33/28 600/509 |
| 2005/0165294 | A1* | 7/2005 | Weiss | A61B 6/501 600/410 |
| 2005/0267348 | A1* | 12/2005 | Wollenweber | A61B 6/544 600/407 |
| 2009/0080746 | A1* | 3/2009 | Xu | A61B 5/0037 382/131 |
| 2009/0096454 | A1* | 4/2009 | Reisman | G01R 33/56563 324/320 |
| 2010/0220909 | A1* | 9/2010 | Thielemans | G06T 11/005 382/131 |
| 2011/0115484 | A1* | 5/2011 | Lee | G01R 33/5635 324/309 |
| 2012/0271155 | A1 | 10/2012 | Stemmer | |
| 2013/0090946 | A1* | 4/2013 | Foo | G16H 10/65 705/3 |
| 2013/0105699 | A1* | 5/2013 | Asma | A61B 6/488 250/363.03 |
| 2016/0216354 | A1* | 7/2016 | Wang | G01R 33/5635 |
| 2020/0364908 | A1 | 11/2020 | Li et al. | |
| 2021/0373105 | A1* | 12/2021 | Polak | G01R 33/56509 |
| 2022/0065971 | A1 | 3/2022 | Polak et al. | |

OTHER PUBLICATIONS

M. W. Haskell et al. "TArgeted Motion Estimation and Reduction (TAMER): Data consistency based motion mitigation for mri using a reduced model joint optimization," IEEE Trans. Med. Imaging, vol. 37, No. 5, pp. 1253 1265, 2018.

A. Loktyushin et al., "Blind retrospective motion correction of MR images," Magn. Reson. Med., 2013.

L. Cordero-Grande, et al., "Sensitivity Encoding for Aligned Multishot Magnetic Resonance Reconstruction," IEEE Trans. Comput. Imaging, 2016.

D. Atkinson et al., "Automatic correction of motion artifacts in magnetic resonance images using an entropy focus criterion," IEEE Trans. Med. Imaging, 1997.

L. Cordero-Grande et al., "Three-dimensional motion corrected sensitivity encoding reconstruction for multi-slice MRI: Application to neonatal brain imaging," Magn. Reson. Med., 2018.

M. W. Haskell et al., "Network Accelerated Motion Estimation and Reduction (NAMER): Convolutional neural network guided retrospective motion correction using a separable motion model," Magn. Reson. Med., vol. 82, No. 4, pp. 1452-1461, 2019.

D. Gallichan et al., "Retrospective correction of involuntary microscopic head movement using highly accelerated fat image navigators (3D FatNavs) at 7T," Magn. Reson. Med., 2016.

R. Bammer et al., "Augmented generalised SENSE reconstruction to correct for rigid body motion," Magn. Reson. Med., 2007.

M. D. Tisdall et al., "Volumetric navigators for prospective motion correction and selective reacquisition in neuroanatomical MRI," Magnetic Resonance in Medicine, 2012.

B. Bilgic et al., "Wave-CAIPI for highly accelerated 3D imaging," Magn. Reson. Med., vol. 73, No. 6, pp. 2152 2162, 2015.

L. Cordero-Grande et al., "Motion corrected MRI with DISORDER: Distributed and Incoherent Sample Orders for Reconstruction Deblurring using Encoding Redundancy," Oct. 2019.

D. Polak et al., "Wave-CAIPI for highly accelerated MP-RAGE imaging," Magn. Reson. Med., vol. 79, No. 1, pp. 401-406, 2018.

D. Polak et al., "Highly-accelerated volumetric brain protocol using optimized wave-CAIPI encoding," in Proc. Intl. Soc. Mag. Res. Med., 2018, p. 0937.

D. Polak et al., "Scout Acquisition enables rapid Motion Estimation (SAME) for fully separable retrospective motion mitigation," in Proceedings of ISMRM 28th Annual Meeting, 2020.

A. Loktyushin et al., "Blind Multirigid retrospective motion correction of MR images," Magn. Reson. Med., 73:1457-1468, 2015.

* cited by examiner

SCOUT ACQUISITION ENABLES RAPID MOTION ESTIMATION AND REDUCTION (SAMER) SYSTEMS AND METHODS FOR RETROSPECTIVE MOTION MITIGATION

CROSS REFERENCE TO RELATED APPLICATIONS

This patent application claims priority to, and the benefit of, U.S. Provisional Patent Application No. 63/031,760, filed May 29, 2020, which is incorporated herein by reference in its entirety.

BACKGROUND

Field

The disclosure relates to systems and methods for reducing motion artifacts in magnetic resonance image data acquired from a patient using a scout scan, including Scout Acquisition enables rapid Motion Estimation and Reduction (SAMER) techniques.

Related Art

Navigator-free retrospective motion correction techniques may perform image reconstruction by solving $$\min_{\vec{\theta}} \min_{x} \left\| \sum M_i F C T_{\theta_i} R_{\theta_i} x - k_i \right\|_2$$

where ki denotes the multi-channel k-space data of shot i, x is the image, TθiRθi is the shot-dependent translation and rotation motions, C is the coil sensitivity, F is the Fourier transformation, and Mi is the undersampling mask. All shots are coupled in this inverse problem and the non-convex estimation of several hundreds of temporal motion parameters is computationally demanding.

Substantial speed-up was demonstrated using Network Accelerated Motion Estimation and Reduction (NAMER) techniques, which can solve for the motion parameters in each shot separately using a good initial image estimate $\hat{x}$, obtained using, for example, Machine Learning.

$$\min_{\vec{\theta}} \left\| \sum M_i F C T_{\theta_i} R_{\theta_i} \hat{x} - k_i \right\|_2$$

However, for this method to work robustly, large amounts of training data (motion-corrupted & motion-free) are needed to enable generalizability to arbitrary motion patterns. Moreover, repeated updates of the motion parameters θ are typically required to refine the Machine Learning generated image $\hat{x}$ and arrive at the correct motion estimate.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the disclosure and to enable a person skilled in the pertinent art to make and use the embodiments.

Figure 1:
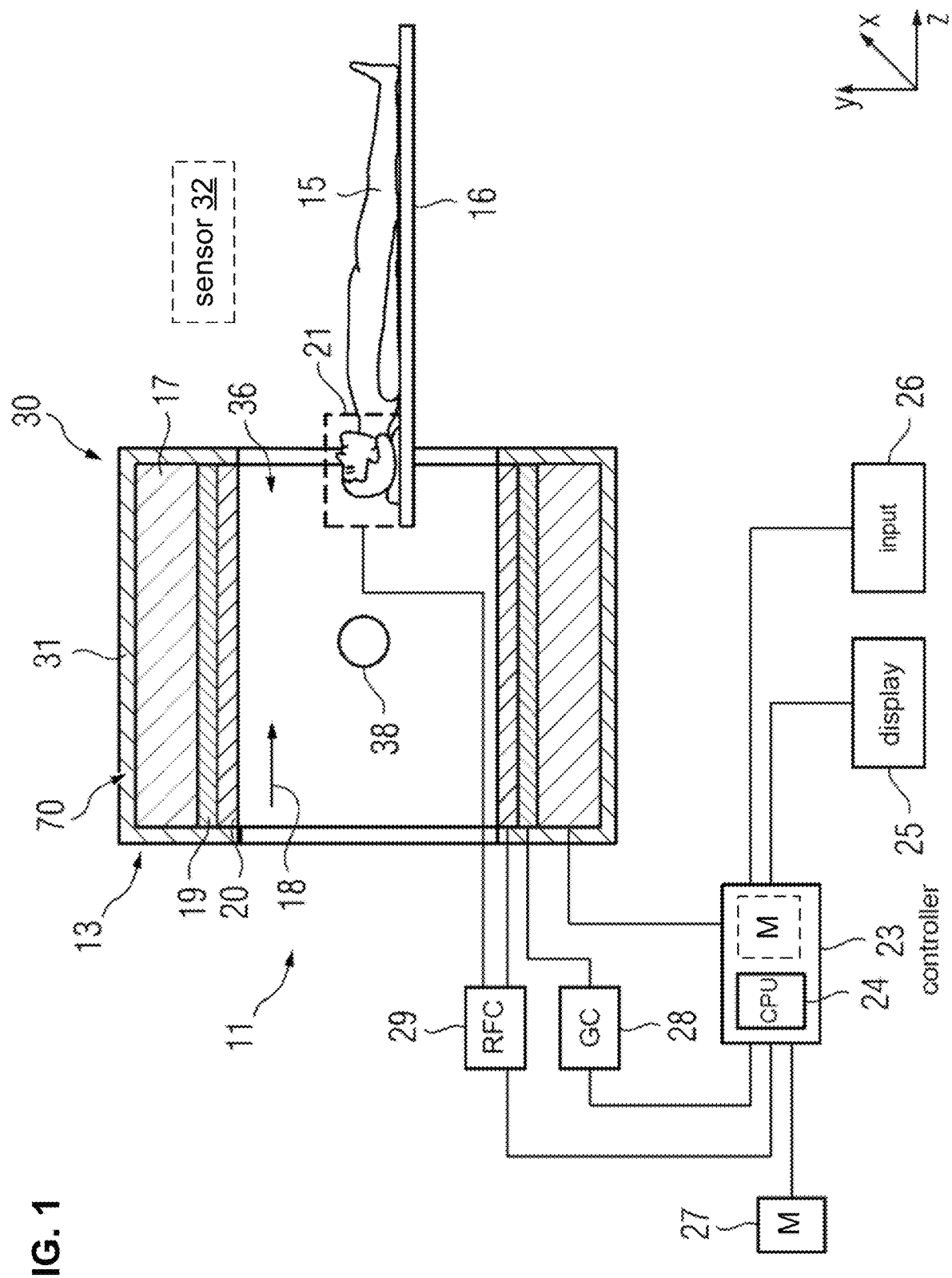
FIG. 1 is a schematic representation of a magnetic resonance imaging system according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to reduce an influence of patient motion on magnetic resonance image data.

The disclosure includes methods to reduce motion artifacts in magnetic resonance image data acquired from a patient. A motion artifact may represent any blurring, streaking, smearing and/or shading, as well as diffuse image noise and/or ghosting in magnetic resonance images caused by a movement of the patient during a magnetic resonance measurement. The movement may include voluntary and/or involuntary movement. Examples for common patient movements are, amongst others, tilting or turning a head, blinking, swallowing, rolling an eye, respiratory motion, etc.

In a method according to an exemplary embodiment, the patient is positioned in an imaging region of a magnetic resonance imaging device configured to perform a magnetic resonance measurement of the region (e.g. head) of the patient. An imaging region may represent a volume where the patient is positioned to perform a magnetic resonance measurement of the patient. The imaging region is at least partially encompassed by a magnetic field generator of the magnetic resonance imaging device. For example, the imaging region may be confined by the magnetic field generator in at least one spatial direction, at least two spatial directions or at least three spatial directions. It is also conceivable that the imaging region is encompassed by the magnetic field generator in a circumferential direction. The magnetic field generator may be configured to provide a homogenous, static magnetic field (B0-field), a magnetic gradient field and/or a high frequency magnetic field (B1-field) inside the imaging region of the magnetic resonance imaging device. In an exemplary embodiment, the magnetic field generator is configured to provide an imaging volume within the imaging region. The imaging volume may be characterized by a particularly homogenous magnetic field or an approximately linear magnetic gradient field. The imaging volume may be an isocenter of the magnetic resonance imaging device. In an exemplary embodiment, the dimension of the imaging volume may correspond to a dimension of the diagnostically relevant area. It is conceivable that the magnetic resonance imaging device encloses at least a part of the head of the patient when the patient is positioned in the imaging region. Positioning the head of the patient in the imaging region may involve locking the head of the patient in a predefined relative position to the magnetic resonance imaging device. For example, the magnetic resonance imaging device may comprise adjustable mechanical elements and/or fasteners configured to fix the head of the patient in a predefined position. The fixing of the anatomy (e.g. head) of the patient prevents the head from moving during the magnetic resonance measurement.

The method may include performing the magnetic resonance measurement to acquire magnetic resonance image data of the head region of the patient. A magnetic resonance measurement may include performing an imaging sequence that may be characterized by one or more imaging parameters. The imaging parameter(s) may determine, for example, a size and/or position of the imaging volume, a property and/or temporal succession of the magnetic gradient field and/or the high frequency magnetic field, as well as a time for readout of magnetic resonance signals from the imaging volume. Examples for commonly used imaging parameters are a repetition time, an echo time, a field of view, a spatial resolution and the like. In an exemplary embodiment, the imaging sequence is configured to provide a high signal intensity or a bright contrast of the diagnostically relevant area of the patient. For example, the imaging sequence may include an echo time accounting for the T2-relaxation time associated with the anatomical region of interest (e.g. brain) of the patient.

In an exemplary embodiment, the method includes performance of a motion correction process during the magnetic resonance measurement. The motion correction process advantageously reduces an influence of a patient motion on the magnetic resonance image data. The method may also include mechanically limiting or restricting the motion of the patient. For example, the magnetic resonance imaging device may include a mechanical means, such as a fastener, which is configured to arrest the head of the patient in a predefined position in order to limit a movement of the patient's head.

However, the motion correction technique may also comprise techniques for determining and/or quantifying a motion of the patient during the magnetic resonance measurement. In particular, the motion correction may comprise techniques for correcting acquired magnetic resonance image data based on a determined and/or quantified patient motion. This concept is referred to as retrospective correction of the magnetic resonance image data. It is also conceivable, that the motion correction technique comprises adjusting imaging parameters of an imaging sequence in real-time during the magnetic resonance measurement in order to prospectively correct the acquired magnetic resonance image data. The patient motion may be determined by employing a sensor, such as a motion sensor and/or an optical sensor, which is configured to acquire information on a movement of the patient during the magnetic resonance measurement. The motion correction technique may further comprise using algorithms, particularly image processing algorithms, configured to compensate for patient movement by processing or manipulating the acquired magnetic resonance image data or the reconstructed magnetic resonance images in dependence of information acquired via the sensor.

By reducing an influence of a patient motion on the magnetic resonance image data, an occurrence of motion artifacts in magnetic resonance images can advantageously be reduced or avoided. Thus, a quality of magnetic resonance images can be increased and a risk for misdiagnosis of magnetic resonance images and/or a need for repetition of the magnetic resonance measurement can advantageously be decreased.

The magnetic resonance imaging system according to an exemplary embodiment includes a magnetic resonance imaging device (i.e. scanner) and a controller (with may include a processor) that is configured to control the scanner and execute the methods of the present disclosure. In order to acquire, process and/or store data, such as magnetic resonance image data and/or motion data, the controller may include processing circuitry and internal and/or external memory, as well as a suitable interface configured to transmit and receive data and/or convert data into a desired data format. The controller may include a microcontroller, processor (e.g. CPU, GPU) and/or other processor circuitry. The controller may also include an internal memory and/or access an external memory. The internal and/or external memory may include any well-known memory or computer storage medium such as, for example, a RAM, ROM, PROM, EPROM, EEPROM, flash memory, as well as an HDD, an SSD and the like. However, the processor may also have access to an external data storage, i.e. an external server or a cloud storage, connected to the processor via a suitable network connection. The data may be transported between components via analog and/or digital signals using suitable signal connections.

In an exemplary embodiment, the magnetic resonance device is a dedicated scanner configured to acquire magnetic resonance image data of a specific body region of the patient, but is not limited thereto. For example, the magnetic resonance imaging device may be configured to perform a magnetic resonance measurement of the head (e.g. brain) of the patient. Thus, an imaging volume of the magnetic resonance imaging device may be tailored to match a diagnostically relevant area, such as the brain of the patient. Particularly, the imaging region of the dedicated scanner may be configured to match the specific body region of the patient.

In providing a processor configured to correct for a movement of the patient in dependence of motion data and, a quality of magnetic resonance image data acquired from brain of the patient can be increased advantageously.

The computer program product according to exemplary embodiments can be loaded into a memory of a programmable processor of a magnetic resonance imaging system. The computer program product may include executable program code that when executed by a processor of the magnetic resonance imaging system, causes the magnetic resonance imaging system to perform a method according to the disclosure. As a result, the method according to the disclosure can be carried out quickly, and in a robust and repeatable manner. The computer program product is configured in such a way that it can carry out the method steps according to the disclosure by the processor.

The computer program product is, for example, stored on a computer-readable medium or stored on a network, a server or a cloud, from where it can be loaded into the processor of a local processor. The local processor can be directly connected to the magnetic resonance imaging system or designed as part of the magnetic resonance imaging system. Furthermore, control information of the computer program product can be stored on an electronically readable medium. The control information on the electronically readable medium can be designed in such a way that, when the medium is used, it carries out a method according to the disclosure in a processor of the magnetic resonance imaging system. The electronically readable medium is a memory, such as a DVD, a magnetic tape, or a USB stick on which electronically readable control information (e.g. software) is stored. This control information may be read from the medium and stored in a controller and/or processor of a magnetic resonance imaging system.

FIG. 1 shows a magnetic resonance imaging (MRI) system 11 according to an exemplary embodiment of the disclosure. The magnetic resonance imaging system 11 includes a magnetic resonance (MR) device (MR scanner) 13 with a static field magnet 17 that provides a homogenous, static magnetic field 18 (B0 field). The static magnetic field 18 includes an isocenter 38 and a cylindrical imaging region 36 for receiving a patient 15. The imaging region 36 is surrounded by the magnet arrangement 30 in a circumferential direction. The patient support 16 is configured to transport the patient 15 into the imaging region 36. In particular, the patient support 16 may transport a diagnostically relevant region of the patient 15 into an imaging volume defined by the isocenter 38 of the magnetic resonance imaging device 13. The magnetic resonance device 13 may be screened from an environment by a housing shell 31.

The magnetic resonance device 13 further includes a gradient magnet arrangement 19 configured to provide magnetic gradient fields used for spatial encoding of magnetic resonance signals during the magnetic resonance measurement. The gradient magnet arrangement 19 is activated by a gradient controller 28 via an appropriate current signal.

The magnetic resonance device 13 further includes a radiofrequency antenna 20 (body coil), which may be integrated into the magnetic resonance device 13. The radiofrequency antenna 20 is operated via a radiofrequency controller 29 that controls the radiofrequency antenna 20 to generate a high frequency magnetic field and emit radiofrequency excitation pulses into an examination space, which is essentially formed by the imaging region 36. The magnetic resonance imaging system 11 may further includes a local coil 21, which is positioned on or in proximity to the diagnostically relevant region (e.g. head) of the patient 15. The local coil 21 may be configured to emit radiofrequency excitation pulses into the patient 15 and/or receive magnetic resonance signals from the patient 15. It is conceivable, that the local coil 21 is controlled via the radiofrequency controller 29.

The magnetic resonance imaging system 11 further includes a controller 23 configured to control the magnetic resonance imaging system 11. In an exemplary embodiment, the controller 23 is configured to control the MRI device 13 to perform MR measurements, perform one or more scout scans, and perform motion-correction processing on MR image data based on the scout scan. The controller 23 may generate one or more MR images based on the MR image data acquired from the MR measurement(s), which may include generating MR images based on MR image data that has been subjected to motion correction. The controller 23 may output the MR image(s) to be displayed on a display (output unit 25) and/or output a computer data signal corresponding to the MR image(s). The MR image(s) may be stored in the memory 27. In an exemplary embodiment, the controller 23 may generate "corrected" MR images based on MR image data that has been subjected to motion correction and "uncorrected" MR images based on MR image data that has not been subjected to motion correction. The controller 23 may then provide both the corrected and uncorrected MR images as an output (e.g. on the display) to facilitate, for example, a comparison of the corrected and uncorrected MR images. In this example, the corrected MR image data corresponds to the uncorrected MR image data so that the uncorrected MR images correspond to the corrected MR images so that a comparison can be made between the corresponding images.

The controller 23 may include a processor 24 configured to process magnetic resonance signals and reconstruct magnetic resonance images. The processor 24 may also be configured to process input from a user of the magnetic resonance imaging device 13 and/or provide an output to the user. For this purpose, the processor 24 and/or the controller 23 can be connected to an output unit 25 (e.g. display, touchscreen, speaker) and an input unit 26 (e.g. keyboard, mouse, touchscreen) via a suitable signal connection. For a preparation of a magnetic resonance measurement, preparatory information, such as imaging parameters or patient information, can be provided to the user via the output unit 25. The input unit 26 may be configured to receive information and/or imaging parameters from the user. The output unit 25 and the input unit 26 may also be implemented as a combined interface, such as a touch-screen interface. In an exemplary embodiment, the controller 23 includes processing circuitry that is configured to perform one or more functions and/or operations of the controller 23, including controlling the MR imaging system 11 and/or the MR device 13, processing magnetic resonance signals, reconstructing magnetic resonance images, controlling the MRI device 13 to perform MR measurements and/or perform one or more scout scans, performing motion-correction processing, processing input from the user of the magnetic resonance imaging device 13 and/or providing an output to the user.

In an exemplary embodiment, the controller 23 also include an internal and/or external memory 27. The internal and/or external memory 27 may include any well-known memory or computer storage medium. The memory 27 may store any data or information, such as patient data, image data, image models, control information, image parameters. The data or information may be provided by the input unit 26, read from the scanner 13 (or other component(s) of the system), and/or other source as would be understood by one of ordinary skill in the art.

As will be appreciated by one of ordinary skill, the magnetic resonance imaging system 11 may include further conventional imaging system components, but have been omitted herein for brevity.

In an exemplary embodiment, the MRI system 11 is configured to use a SAMER (scout acquisition enables rapid motion estimation and reduction) technique to reduce motion artifacts in acquired magnetic resonance image data.

In an exemplary embodiment, SAMER utilizes a single rapid scout scan x̂ to drastically reduce the computation cost for navigation-free retrospective motion-correction while not relying on pre-trained Machine Learning networks. This avoids the need for repeated updates of the imaging volume during the motion estimation.

In an exemplary embodiment, the single, rapid scout scan has a duration of, for example, $T_{add}$=3 sec, but is not limited thereto. In one or more embodiments, the duration $T_{add}$ can be set to not exceed 3 seconds, not exceed 5 seconds, not to exceed 6 seconds, not to exceed 8 seconds, or not exceed 10 seconds. In one or more embodiments, the duration $T_{add}$ has a value within the range of 1-10 seconds, 3-10 seconds, 3-8 seconds, or 3-6 seconds. In one or more other embodiments, the scout scan is a three-dimensional (3D) volumetric scout scan. The scout scan is not limited to 3D scout scans and the scout scan can be a two-dimensional (2D) scout scan in one or more embodiments.

By employing this single rapid scout scan, the computation cost of motion-estimation is advantageously reduced and thereby increases the adoptability in clinical environments. In contrast, navigation-free retrospective motion-correction typically requires estimating hundreds of coupled temporal motion parameters by solving a large non-linear inverse problem. For example, conventional techniques are computationally demanding as they require a repetitive process of alternating between updating the image estimate x and the motion parameters θ. The large number of repetitions can lead to increased reconstruction times. This can be extremely demanding computationally, which has impeded implementation and adoption in clinical settings. Further, these techniques often experience instability and are susceptible to local minima of the optimization.

Figure 2:
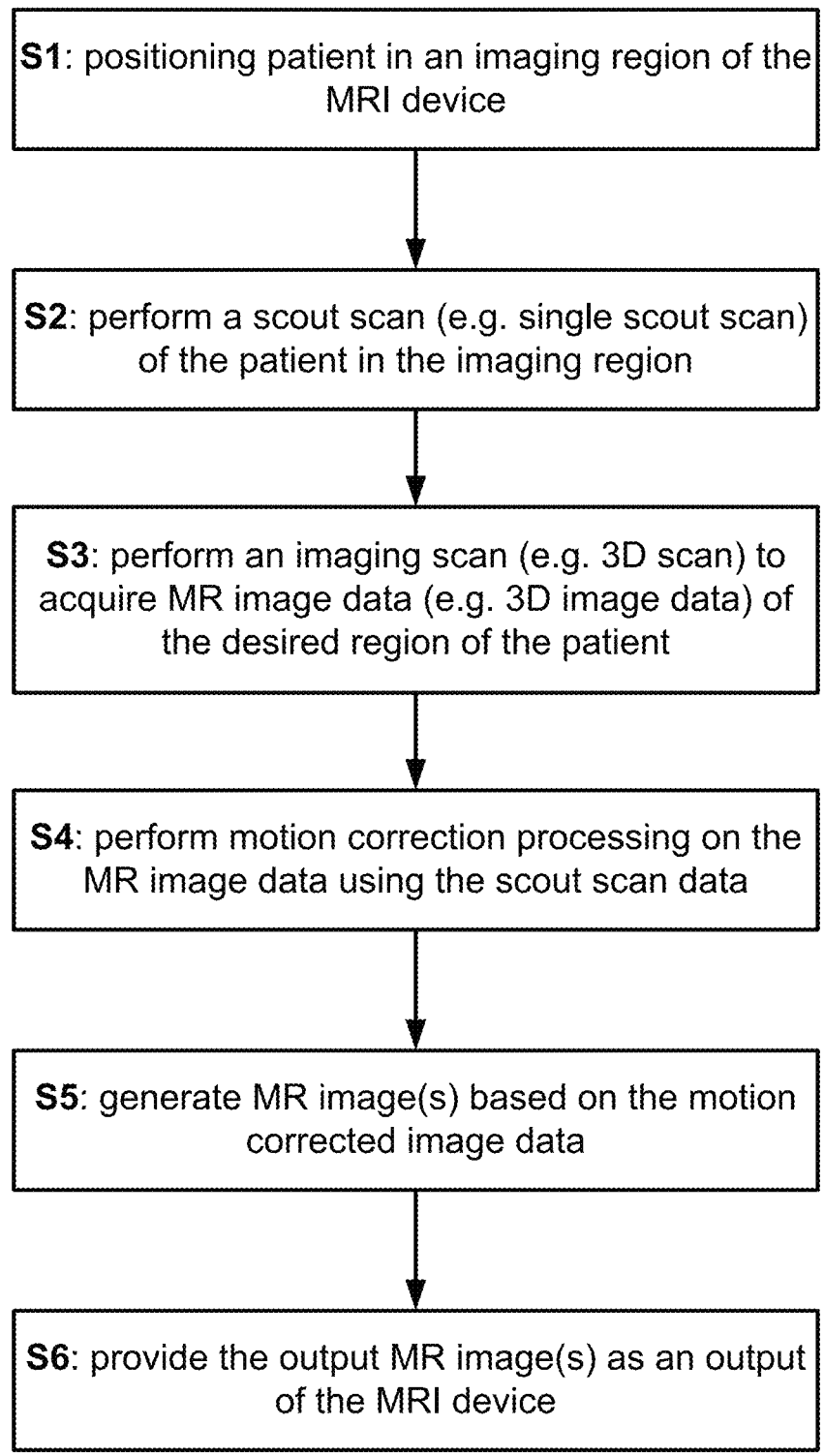
FIG. 2 is a flowchart of a method for reducing motion artifacts according to an exemplary embodiment of the disclosure.

FIG. 2 depicts a flowchart of an inventive method for reducing motion artifacts in magnetic resonance image data acquired from a region of the patient 15. The operations of the method are not limited to the order described below and as illustrated in the flowchart, and the various operations may be performed in a different order. For example, the scout scan (S2) can be performed after the imaging scan (S3). Further, two or more operations of the method may be performed simultaneously with each other. Although aspects of the disclosure describe magnetic resonance image data being acquired from the brain of the patient 15, the present disclosure is not limited thereto and aspects of the disclosure can apply to other regions of the patient 15 as would be understood by one of ordinary skill in the art.

In step S1, the patient 15 is positioned in an imaging region 36 of the magnetic resonance imaging device 13 configured to perform a magnetic resonance measurement of the patient 15.

For this purpose, the patient 15 may be positioned on the patient support 16, which is configured to carry the patient 15 into the imaging region 16 either automatically or based on a control instruction provided by a user of the magnetic resonance imaging device 13. As shown in FIG. 2, the magnetic resonance imaging device 13 may also be configured such that the patient 15 is able to autonomously enter the imaging region 36. It is also conceivable, that the magnet arrangement 30 of the magnetic resonance imaging device 13 is positioned relative to the patient 15 in order to match the isocenter 38 with a diagnostically relevant region. In an exemplary embodiment where the region of interest of the patient 15 is the brain of the patient 15, when positioning the patient 15 in the imaging region 36, at least the head of the patient 15 may be supported and/or fixed in a support device to reduce a movement of the patient 15 during the magnetic resonance measurement.

In step S2, the SAMER (scout acquisition enables rapid motion estimation and reduction) technique is employed to reduce motion artifacts in magnetic resonance image data. In an exemplary embodiment, a single rapid scout scan of the region of the patient 15 is performed in the SAMER process. In an exemplary embodiment, the single, rapid scout scan has a duration of, for example, $T_{add}$=3 sec, but is not limited thereto. Although aspects are described with having only a single scout scan, the disclosure is not limited thereto and aspects can include one or more additional scout scans. However, as would be appreciated by one of ordinary skill in the art, the additional scout scans would increase the overall scan time.

In an exemplary embodiment, the scout scan is of a lower resolution than the resolution used in the magnetic resonance measurement performed to acquire magnetic resonance image data of the region of the patient 15 (Step S3). For example, the scout scan can have a 1×4×4 mm$^3$ resolution and R=9 to minimize additional scan time, but are not limited thereto.

Figure 4A:
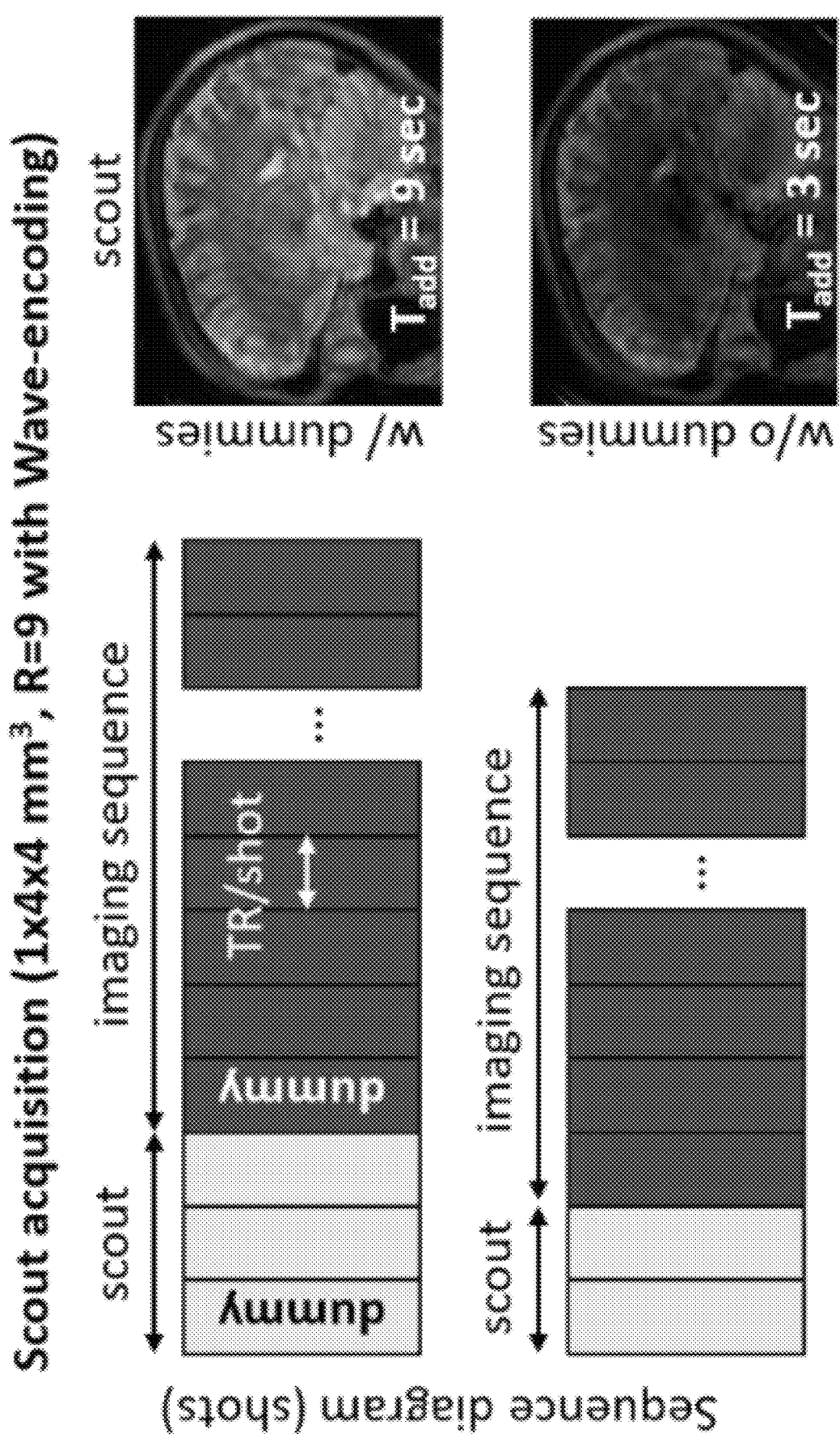
FIGS. 4A-4B illustrate examples of a scout acquisition, according to exemplary embodiments of the disclosure, including omitting dummy shots.

In an exemplary embodiment, dummy shots within the magnetic resonance imaging sequence can be omitted such that the imaging sequence directly follows the scout scan (see FIG. 4A). For example, the scout scan can be performed in place of dummy shots within the magnetic resonance measurement sequence. Further, the dummy shots within the scout scan may be additionally or alternatively omitted. The removal of the dummy shots optimizes the scout acquisition by minimizing the added scan time. This also eliminates the need for scout reacquisition across the clinical exam where several imaging contrasts are acquired.

In an exemplary embodiment, the contrast of the scout scan may be different from the contrast of the imaging scan. For example, the scout contrast does not have to completely/exactly match the contrast of the imaging scan. Advantageously, with aspects of the present disclosure, differences (e.g. small differences) in contrast do not impair the determination and accuracy of the motion parameters. This advantageously allows, for example, the omission of dummy shots at the beginning of the sequence (e.g. a 3D TSE/FSE (SPACE) sequence) and instead the acquisition of the scout data. This has a similar magnetization preparation effect for the SPACE sequence, while at the same time providing scout data for motion correction.

In step S3, a magnetic resonance measurement is performed to acquire magnetic resonance image data of the region of the patient 15. Acquiring magnetic resonance image data may include performing at least one imaging sequence dedicated to the brain or a specific region of the brain of the patient 15.

In an exemplary embodiment, performing the magnetic resonance measurement may include acquiring separate magnetic resonance image data from different portions of the brain of the patient 15. For this purpose, a plurality of imaging sequences, such as at least two imaging sequences, may be performed. It is conceivable that imaging parameters of the at least two imaging sequences are adjusted to enhance a signal intensity, a signal-to-noise ratio, a resolution and/or an acquisition time of magnetic resonance image data of the brain.

In step S4, a motion correction technique is employed based on the scout scan. The motion correction technique reduces an influence of a patient motion on the magnetic resonance image data.

In an exemplary embodiment, the motion is estimated based using the motion-free scout scan ($\hat{x}$). In an exemplary embodiment, the motion is estimated by minimizing the below equation:

$$\min_{\vec{\theta}} \left\| \sum M_i F C T_{\theta_i} R_{\theta_i} \hat{x} - k_i \right\|_2$$

where $k_i$ denotes the multi-channel k-space data of shot i, $T_{\theta_i} R_{\theta_i}$ is the shot-dependent translation and rotation motions, C is the coil sensitivity, F is the Fourier transformation, $M_i$ is the undersampling mask, and $\hat{x}$ is the motion-free scout scan.

In an exemplary embodiment, the motion correction technique includes a prospective and/or retrospective correction of the magnetic resonance image data using the scout scan. The motion correction technique may include performing a separate correction of the acquired magnetic resonance image data based on a respective motion state or relative position of the patient 15. For this purpose, the individual k-space-lines may be transferred to an image space before correction. To compensate for rotational movement of the head of the patient 15, non-Cartesian reconstruction methods may be applied. Non-Cartesian reconstruction methods may include, for example, reconstructing using a SENSE+ motion forward model (image space) or gridding/NUFFT (Non-uniform fast Fourier transform) for reconstructing in k-space. The SENSE+motion forward model is described in Haskell et al., "TArgeted Motion Estimation and Reduction (TAMER): Data Consistency Based Motion Mitigation for MRI Using a Reduced Model Joint Optimization," IEEE Transactions on Medical Imaging, vol. 37, no. 5, pp. 1253-1265, May 2018, which is incorporated herein by reference in its entirety. Other non-Cartesian reconstruction methods may be used as would be understood by one of ordinary skill in the art.

In an exemplary embodiment, the motion correction technique includes positioning a motion sensor on the region of interest and determining a displacement of the motion sensor due to motion of the patient 15 while performing the magnetic resonance measurement. Due to movement of the patient 15, the position of the diagnostically relevant region may vary within the imaging region 36. The movement of the patient 15 may cause a translative movement detected the motion sensor 32. The motion correction technique may include a prospective and/or retrospective correction of the magnetic resonance image data based on the displacement of the sensor 32. In order to compensate for the translative movement, the frequency and/or phase of the radiofrequency excitation pulse emitted via the radiofrequency antenna 20 is adjusted in real-time in such a way, that the imaging volume tracks the diagnostically relevant region of the patient 15 during the magnetic resonance measurement. In a similar fashion, the sensor 32 may also detect a rotational movement of the patient's head. In this case, an encoding gradient of the imaging sequence may be rotated in order to account for the detected movement.

In an exemplary embodiment, the motion correction technique includes employing an optical sensor 32 to acquire optical image data of the patient while performing the magnetic resonance measurement and a prospective and/or retrospective correction of the magnetic resonance image data based on the optical image data. As described above, the processor 24 may be configured to derive motion data of the patient 15 in dependence of optical image data acquired via the sensor 32. The motion data may be used to adjust a field of view, a slice center and/or an excitation pulse frequency for a next acquired k-space line in real-time during the magnetic resonance measurement. For example, encoding gradients of the imaging sequence may be rotated in accordance with a rotational movement of the patient's head, whereas a translational movement may be accounted for by changing a frequency of the radiofrequency excitation pulse. However, the motion data may also be fed back to an image reconstruction algorithm in order to correct the magnetic resonance image data for motion of the patient retrospectively. As described above, this may comprise applying a phase change to the acquired magnetic resonance image data in order to compensate for translational motion and/or applying non-Cartesian reconstruction methods for correcting rotational motion.

In step S5, one or more MR images is generated based on the motion-corrected image data provided by the motion-correction processing.

In step S6, the MR image(s) are output from the MRI system 11 (e.g. from controller 23). The images may be, for example, displayed on a display (output unit 25), stored in memory 27, output as a computer data signal, or the like.

In an exemplary embodiment, the scout scan and the sequence acquisition reordering is optimized in a three-dimensional (3D) Turbo-Spin-Echo (TSE) acquisition, including evaluations in-vivo with up to R=6-fold acceleration and achieve motion-robust rapid imaging via wave-encoding. These optimizations provided robust motion mitigation using a scout with differing contrast to the imaging sequence.

In an exemplary embodiment, encoding reordering of a $T_2w$ SPACE sequence is optimized to improve the robustness of its motion estimation. The Sampling Perfection with Application optimized Contrasts using different flip angle Evolution (SPACE) technique is single slab 3D TSE sequence with slab selective, variable excitation pulse.

Figure 3A:
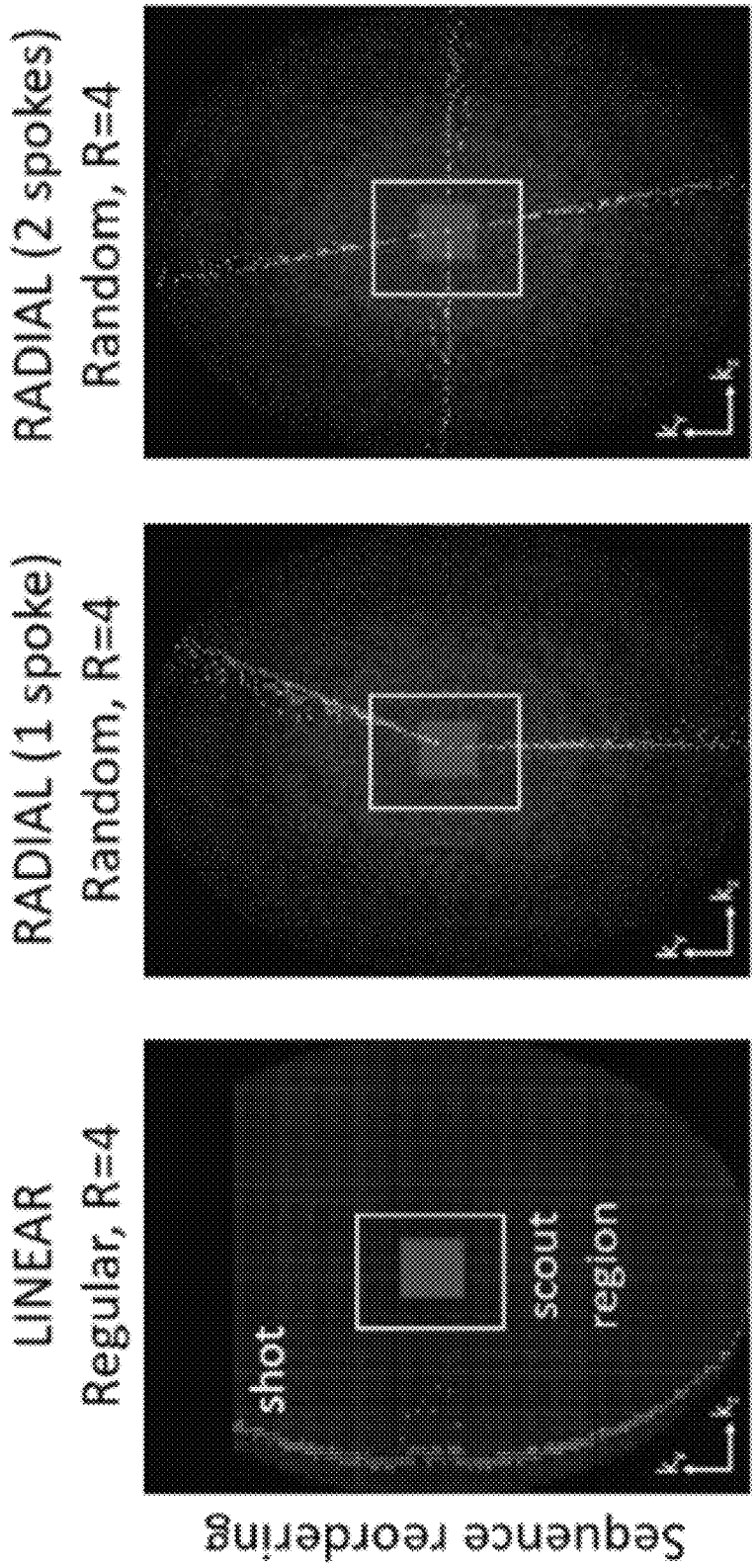
FIGS. 3A-3B illustrate example sequence reordering data according to exemplary embodiments of the disclosure.
Figure 3B:
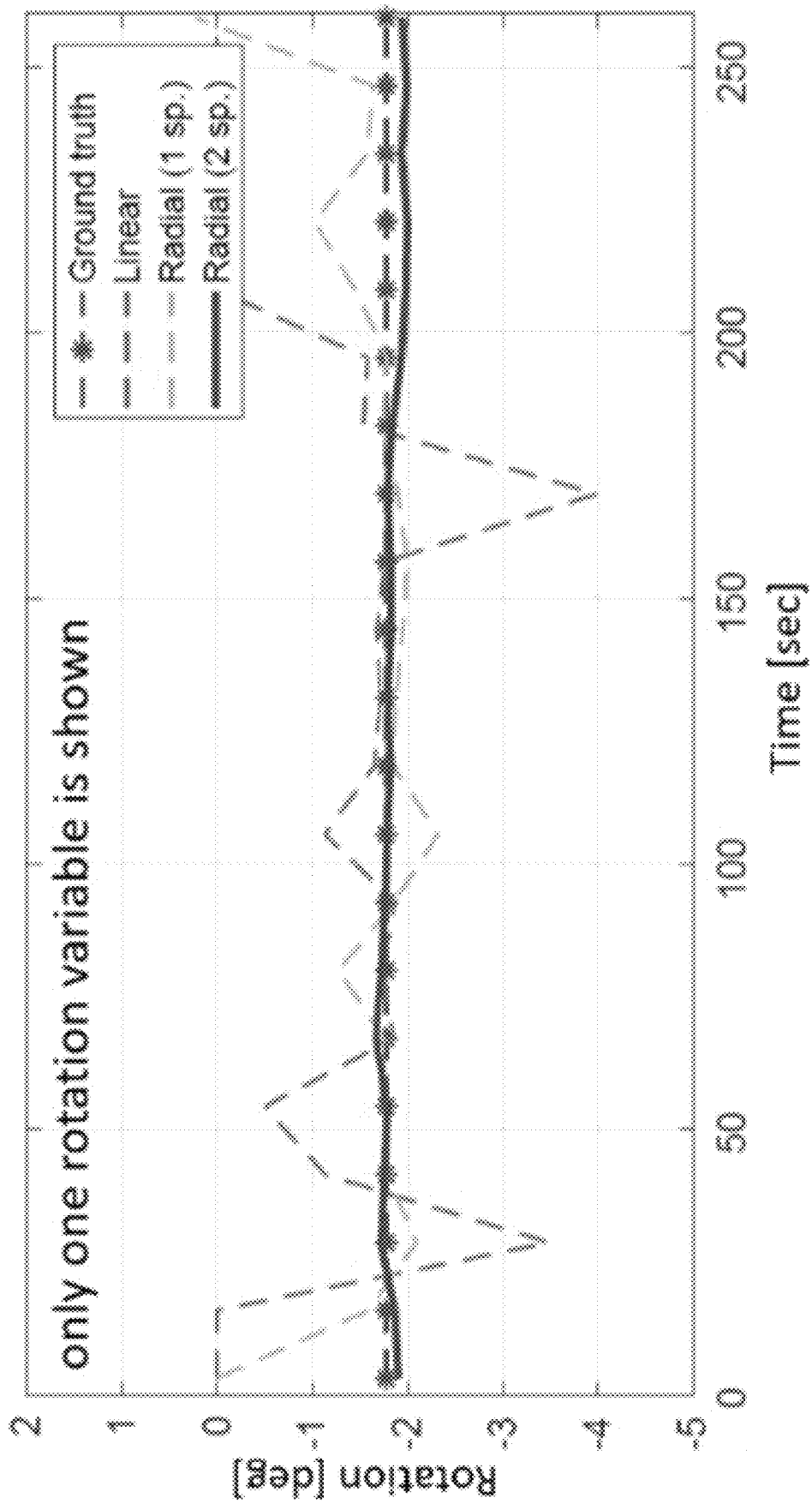

For example, as illustrated in FIGS. 3A and 3B, motion-free data with linear and two types of radial reorderings (with VDS-Poisson) were acquired at 1 mm isotropic resolution and R=4 acceleration using a 3T scanner (e.g. MAGNETOM Vida, Siemens Healthcare, Erlangen, Germany) and 64-channel head coil. After instructed subject motion, a separate motion-free scout scan ($\hat{x}$) was acquired (using the same protocol). The motion is estimated based using the motion-free scout scan ($\hat{x}$). In an exemplary embodiment, the motion is estimated by minimizing the below equation:

$$\min_{\vec{\theta}} \left\| \sum M_i F C T_{\theta_i} R_{\theta_i} \hat{x} - k_i \right\|_2$$

where $k_i$ denotes the multi-channel k-space data of shot i, $T_{\theta_i} R_{\theta_i}$ is the shot-dependent translation and rotation motions, C is the coil sensitivity, F is the Fourier transformation, $M_i$ is the undersampling mask, and $\hat{x}$ is the motion-free scout scan. In the examples illustrated in FIGS. 3A and 3B, motion estimation with respect to the scout scan was performed for each shot (TR) within the $T_2w$ SPACE acquisition, which leads to identical motion-estimates across all shots.

As shown in FIG. 3A, linear reordering provides low k-space overlap between the low-resolution scout scan (yellow) and the shot data (white), resulting in poor motion parameter estimates. Radial reordering (one spoke) generated improved estimates as compared to linear reordering, while radial reordering (two spokes) provided even more of an improvement and the best agreement with the ground truth. In these examples, scout scans were acquired at 1×4×4 mm³ resolution and R=9 to minimize additional scan time, but are not limited thereto. In an exemplary embodiment, sequence reordering can be used that includes a checkered reordering in the center of k-space and a different reordering type for the remainder of k-space. The different reordering can include, for example, linear reordering, radial reordering, spiral reordering, or the like. This reordering technique (which may be referred to as "checkered+") advantageously stabilizes the motion estimation process. The checkered+ sequence reordering process is described in European Application No. 21167589.7, filed on Apr. 9, 2021, titled "Method for acquiring a three-dimensional magnetic resonance image dataset and for generating a motion-corrected image dataset," which is incorporated herein by reference in its entirety. In an exemplary embodiment, other reordering techniques are possible where these other techniques provide that each shot contains at least some center of k-space information that is comparable with the scout scan.

Figure 4B:
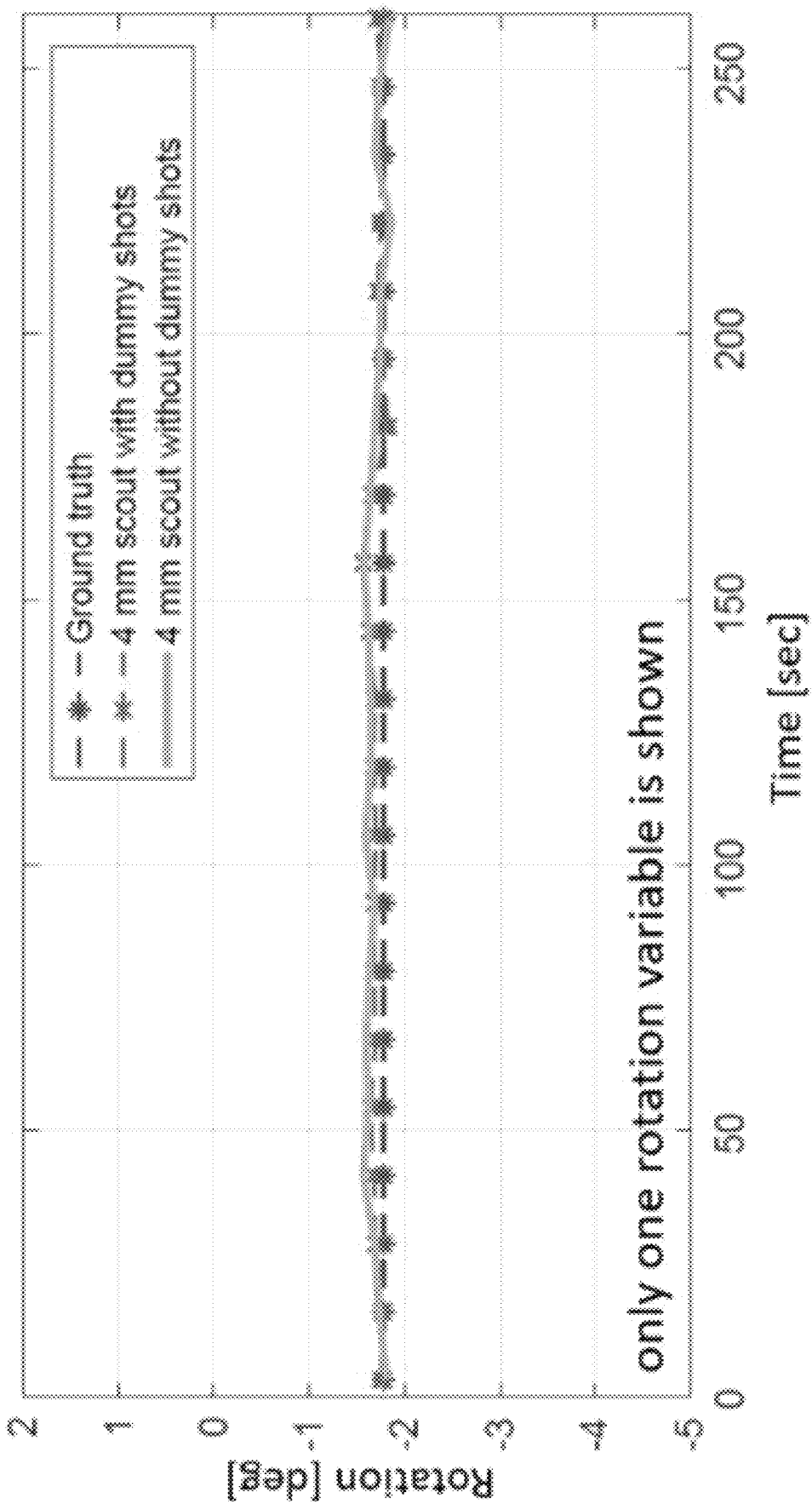

A further advantage was realized regarding dummy shots. In particular, while the removal of dummy shots in the acquisition of the low-resolution scout scans caused increased contrast differences as illustrated in FIGS. 4A-4B, the removal had little or no impact on the motion estimation performance. The removal of the dummy shots optimized the scout acquisition by minimizing the added scan time. This also eliminates the need for scout reacquisition across the clinical exam where several imaging contrasts are acquired.

Figure 5A:
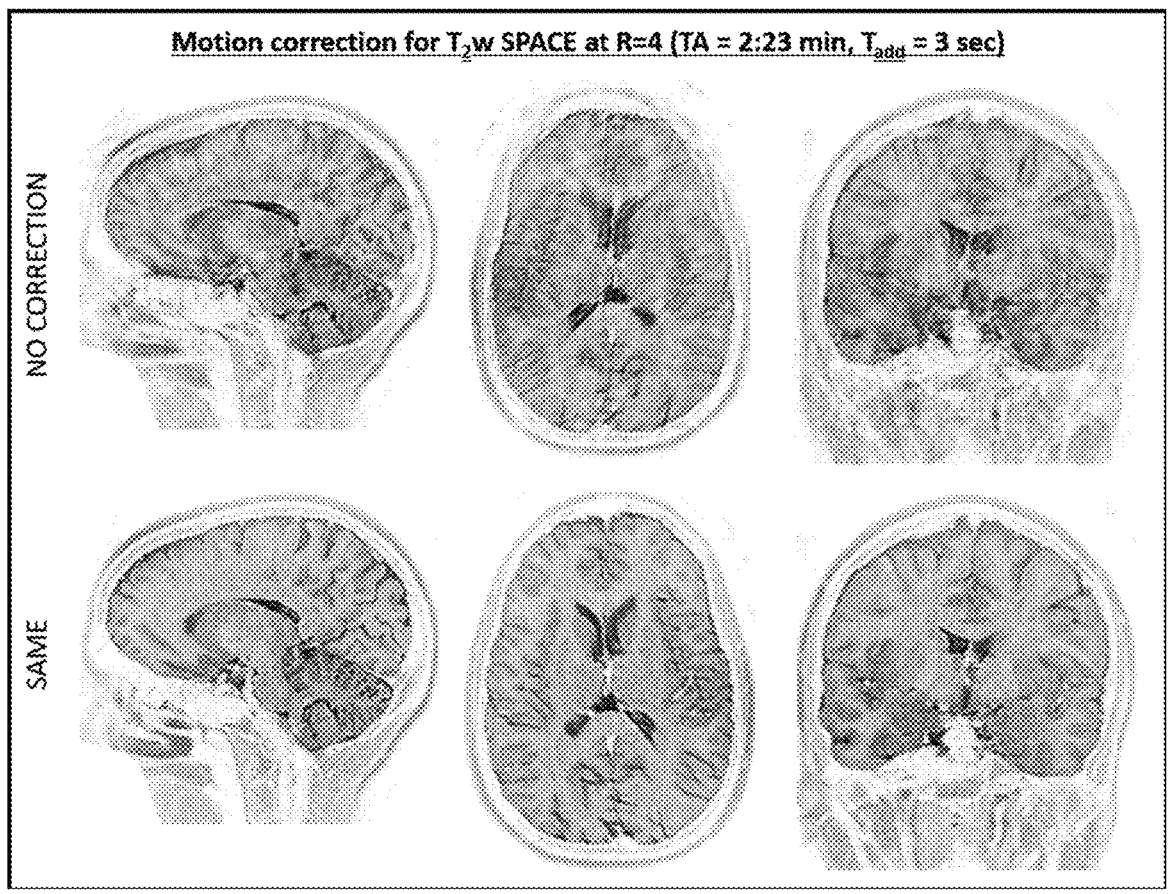
FIGS. 5A-5B illustrate example motion correction images and data according to exemplary embodiments of the disclosure.
Figure 5B:
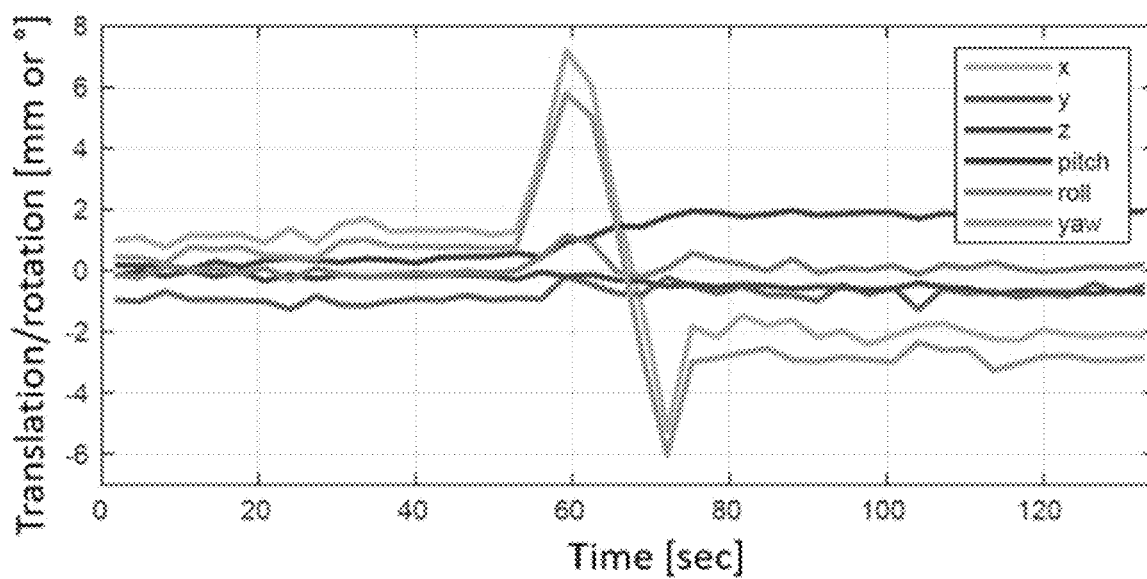

FIGS. 5A-5B illustrate example motion correction results with the application of a single low-resolution scout scan according to exemplary embodiments. FIG. 5A shows images without correct (top) and images that have utilized the SAMER technique (bottom) according to exemplary embodiments. These results included a $T_2w$ SPACE sequence at R=4-fold acceleration. As is shown in the top portion of FIG. 5A, the SENSE reconstruction demonstrates substantial motion artifacts and loss of contrast/resolution. As in the lower portion of FIG. 5A, the motion artifacts and contrast/resolution loss is largely mitigated using the inventive SAMER techniques according to exemplary embodiments without requiring any updated reconstruction of the imaging volume during motion estimation. This advantageously enables parallelization across all shots.

In these examples, the fully-separable motion-estimation took $T_\sigma$=91 sec per shot. As shown in FIG. 5B, motion parameters were estimated for each shot (TR) individually using a single low-resolution scout scan which added $T_{add}$=3 sec to the overall scan time. FIGS.

Figure 6A:
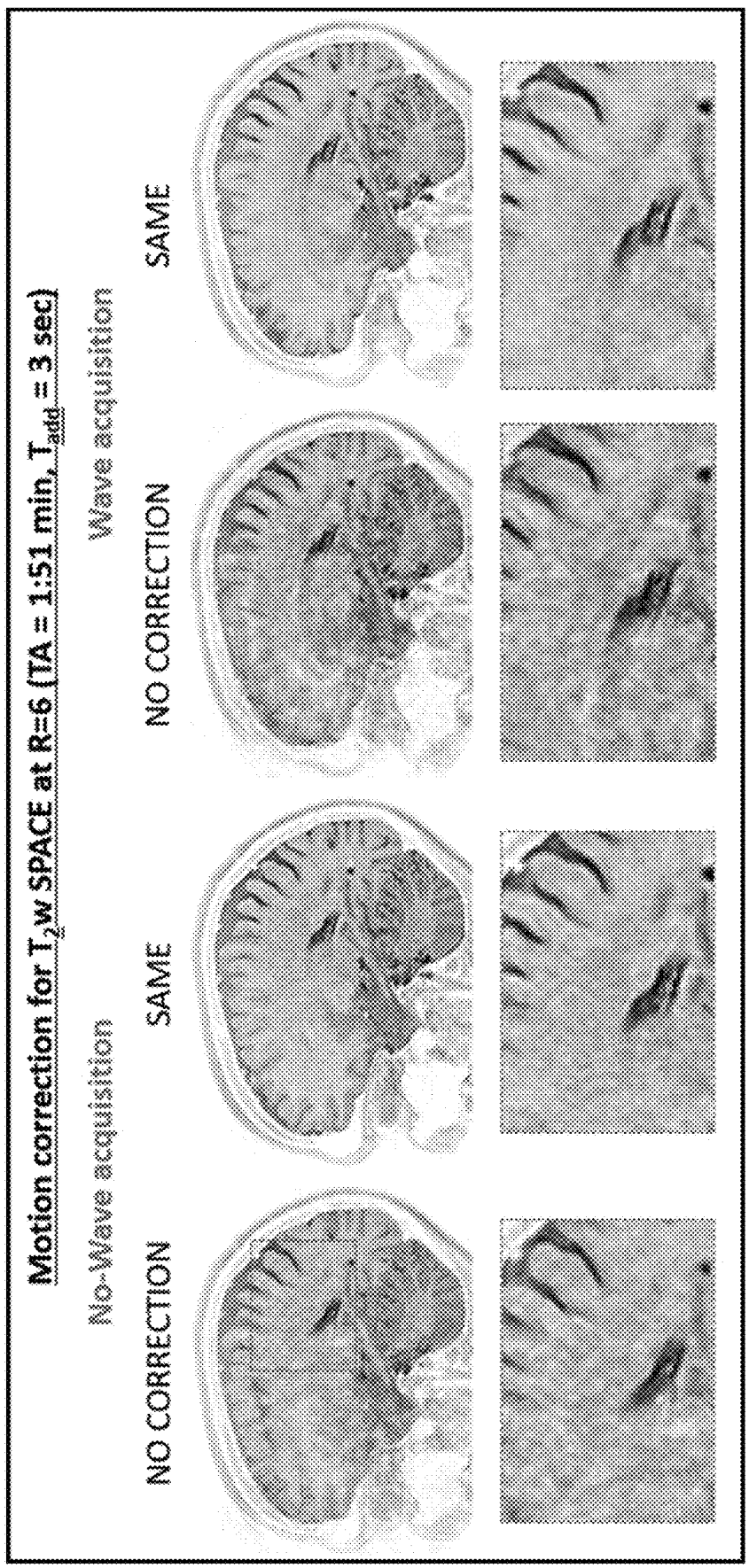
FIGS. 6A-6C illustrate example motion correction images and data with and without wave-acquisition according to exemplary embodiments of the disclosure.
Figure 6B:
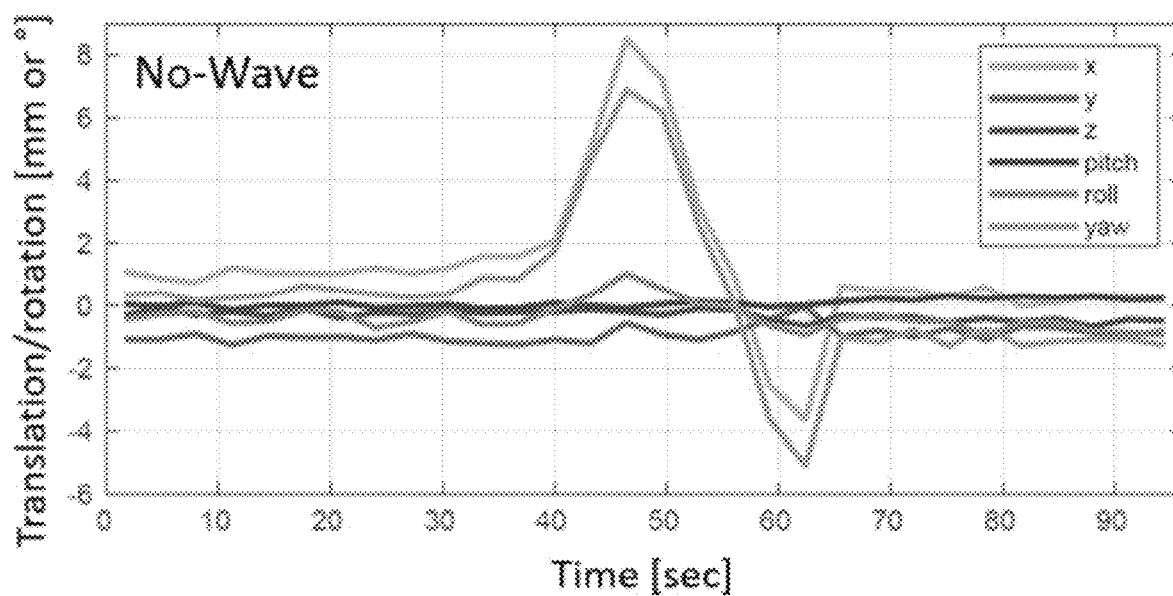
Figure 6C:
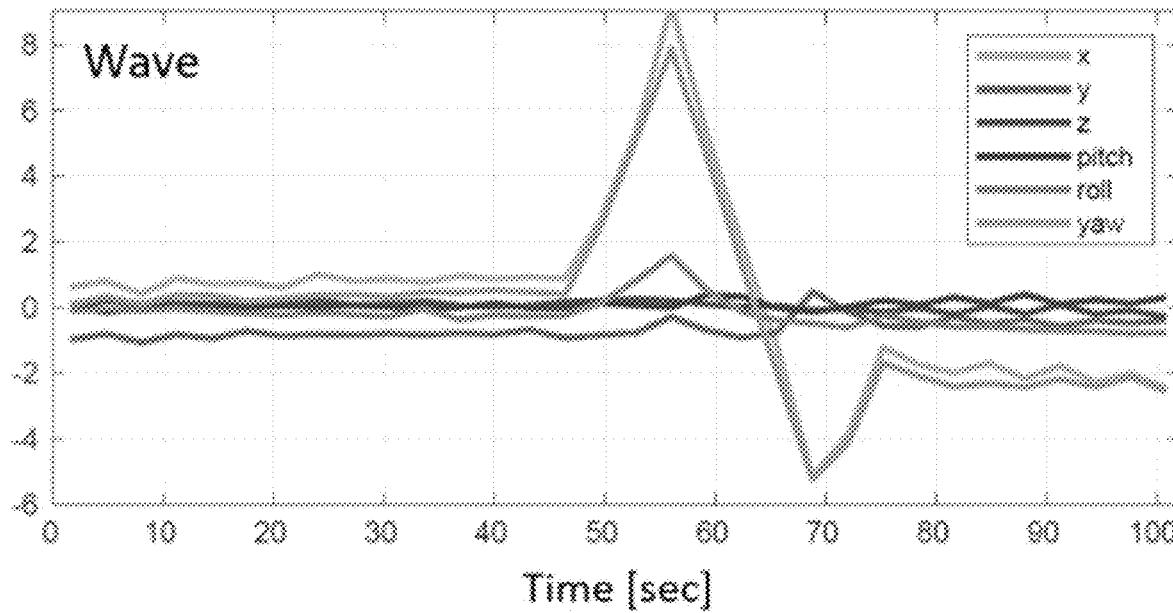

FIGS. 6A-6C illustrate example motion correction results with the application of a single low-resolution scout scan with and without Wave-encoding according to exemplary embodiments. As is shown in FIG. 6A, the inclusion of Wave-encoding (e.g. at R=6, Wave-encoding) in the imaging sequence provides increased suppression of noise amplification and achieves improved image quality with substantial reduction of motion artifacts. In these examples, the motion-estimation on Wave data took $T_\sigma$=2:53 min per shot.

Figure 7A:
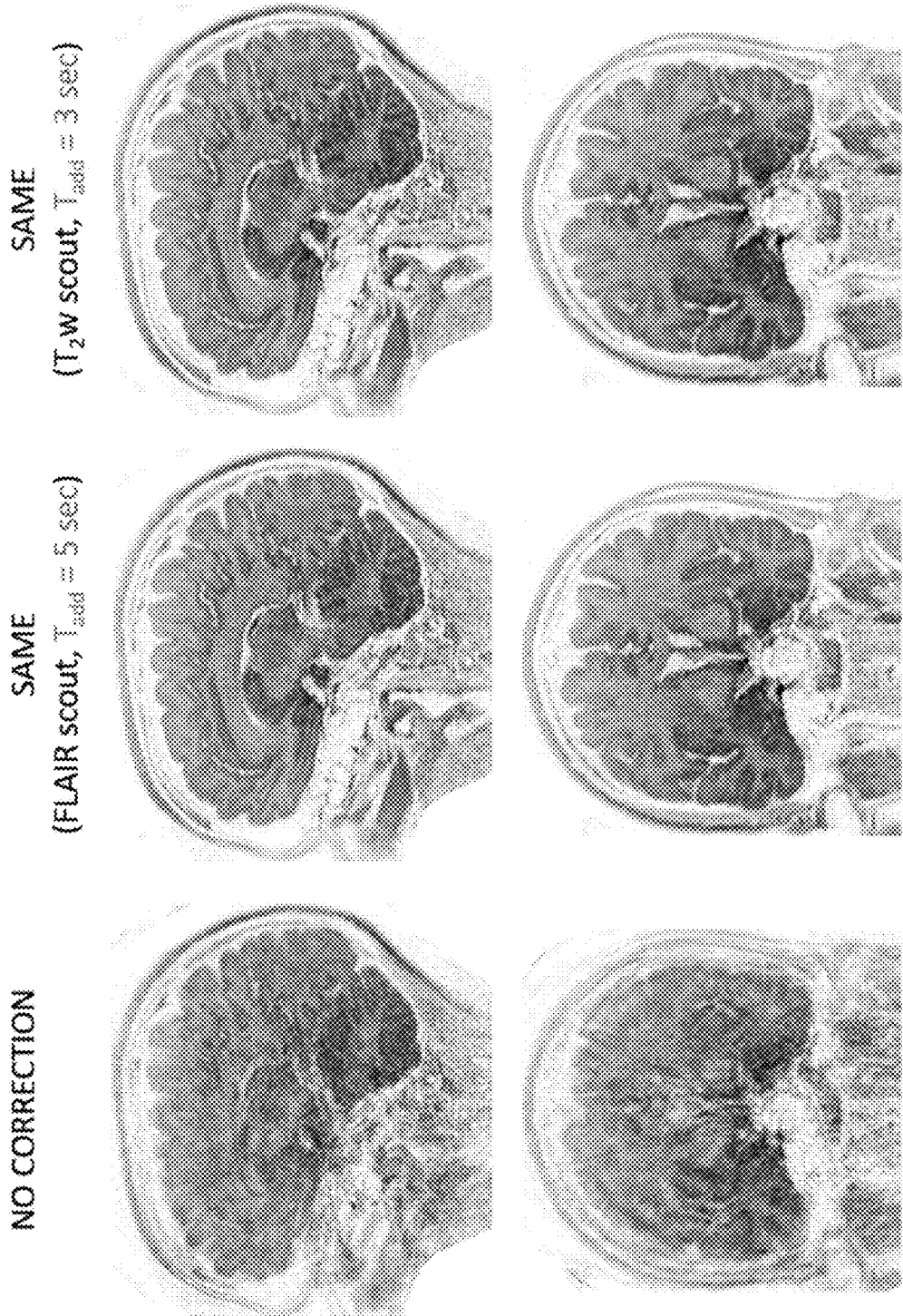
FIGS. 7A-7C illustrate example motion correction images and data for FLAIR-SPACE according to exemplary embodiments of the disclosure.
Figure 7B:
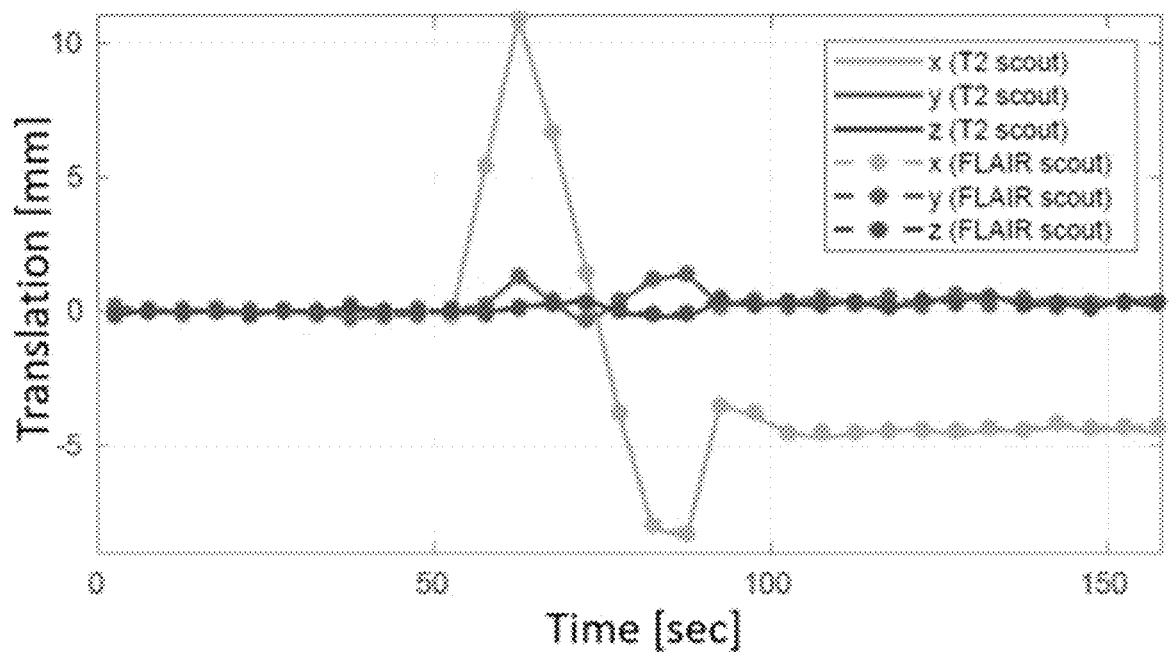
Figure 7C:
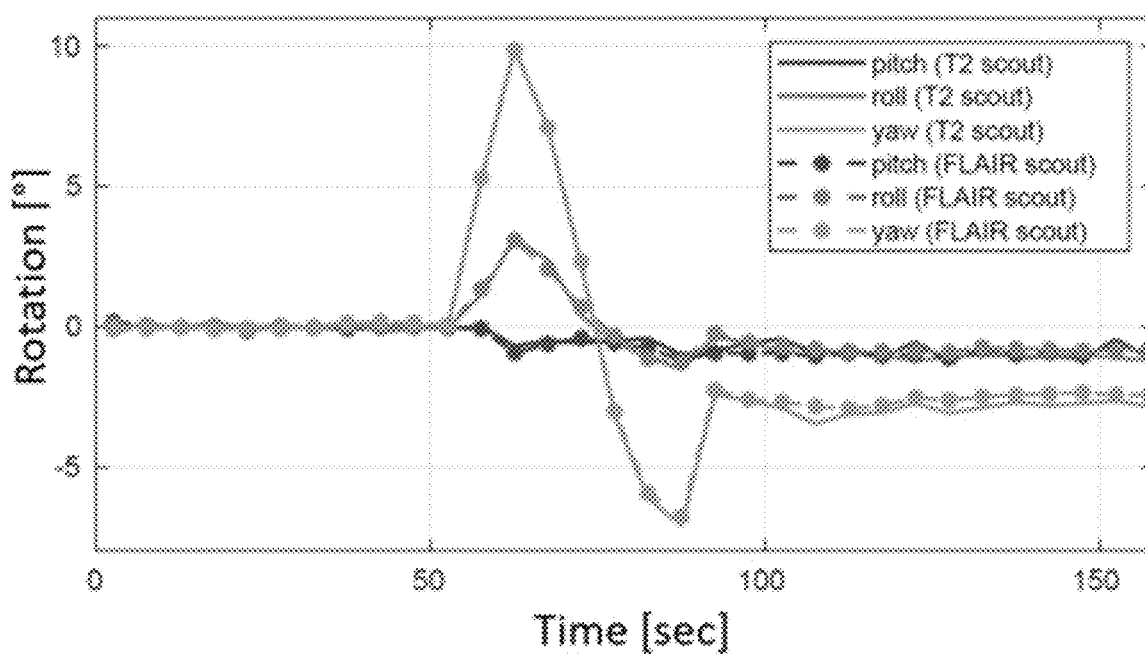

FIGS. 7A-7C illustrate example motion correction results with the application of a single low-resolution scout scan in FLAIR (Fluid-attenuated inversion recovery)-SPACE applications according to exemplary embodiments. In these examples, for FLAIR-SPACE (R=6, Wave), SAMER reconstructions (FIG. 7A) and motion trajectory plots (FIG. 7B-7C), both $T_2w$ and FLAIR scout acquisitions enabled accurate motion estimation for the FLAIR-SPACE dataset. In particular, with the SAMER technique motion artifacts were reduced while contrast differences between the scout (e.g. $T_2w$ SPACE) and imaging sequence (e.g. FLAIR-SPACE) have little or no impact on the motion estimation as illustrated in the motion trajectory plots shown in FIGS. 7B-7C.

The embodiments described above are to be recognized as examples. Individual embodiments may be extended by features of other embodiments. In particular, a sequence of the steps of the inventive methods are to be understood as exemplary. The individual steps can also be carried out in a different order or overlap partially or completely in time.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s), processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or nonvolatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for reducing motion artifacts in magnetic resonance image data acquired from a region of a patient using a magnetic resonance imaging (MRI) device, the method comprising:
   performing a scout scan of the region of the patient;
   performing a magnetic resonance (MR) measurement of the region of the patient by performing a sequence reordering to acquire MR image data of the region of the patient,
   wherein the sequence reordering includes a first reordering type for a center region of k-space and a second reordering type for a remainder of k-space, the second reordering type being different from the first reordering type; and
   performing motion correction on the acquired MR image data based on the scout scan to generate corrected MR image data,
   wherein the motion correction reduces an influence of a patient motion on the MR image data,
   wherein the scout scan has a shorter duration than a duration of the MR measurement and does not exceed 10 seconds.

2. The method according to claim 1, further comprising:
   positioning the patient in an imaging region of the MRI device that is configured to perform the MR measurement of the region of the patient.

3. The method according to claim 1, wherein the motion correction comprises estimating motion parameters based on the scout scan.

4. The method according to claim 1, further comprising:
   generating one or more MR images based on the corrected MR image data; or
   generating one or more MR images based on the corrected MR image data and generating one or more uncorrected MR images based on the acquired MR image data.

5. The method according to claim 1, further comprising:
   outputting the corrected MR image data as a computer data signal.

6. The method according to claim 1, wherein performing the scout scan of the region of the patient comprises performing a single scout scan of the region of the patient.

7. The method according to claim 1, wherein the scout scan has a lower resolution than a resolution of the MR measurement.

8. The method according to claim 1, wherein the scout scan is a three-dimensional (3D) scout scan.

9. The method according to claim 1, wherein the acquired MR image data is three-dimensional (3D) MR image data.

10. The method according to claim 1, wherein the first reordering type is checkered reordering.

11. The method according to claim 1, wherein the second reordering type is linear reordering, radial reordering, or spiral reordering.

12. The method according to claim 1, wherein a contrast of the scout scan is different from a contrast of the MR measurement.

13. A non-transitory computer-readable storage medium with an executable program stored thereon, that when executed, instructs a processor of a magnetic resonance imaging (MRI) device to perform a method for reducing motion artifacts in magnetic resonance image data acquired from a region of a patient, the method comprising:
   performing a scout scan of the region of the patient;
   performing a magnetic resonance (MR) measurement of the region of the patient by performing a sequence reordering to acquire MR image data of the region of the patient,
   wherein the sequence reordering includes a first reordering type for a center region of k-space and a second reordering type for a remainder of k-space, the second reordering type being different from the first reordering type; and
   performing motion correction on the acquired MR image data based on the scout scan to generate corrected MR image data,
   wherein the motion correction reduces an influence of a patient motion on the MR image data,
   wherein the scout scan has a shorter duration than a duration of the MR measurement and does not exceed 10 seconds.

14. A magnetic resonance imaging (MRI) system, comprising:
   a magnetic resonance (MR) scanner configured to perform a MR measurement of a region of a patient; and
   a controller that is configured to:
      control the MR scanner to perform a scout scan of the region of the patient;
      control the MR scanner to perform the MR measurement of the region of the patient by performing a sequence reordering to acquire MR image data of the region of the patient,
   wherein the sequence reordering includes a first reordering type for a center region of k-space and a second reordering type for a remainder of k-space, the second reordering type being different from the first reordering type; and perform motion correction on the acquired MR image data based on the scout scan to generate corrected MR image data, wherein the motion correction reduces an influence of a patient motion on the MR image data, wherein the scout scan has a shorter duration than a duration of the MR measurement and does not exceed 10 seconds.

15. The MRI system according to claim 14, wherein the MR scanner further comprises a patient support, and
wherein the controller is further configured to control the patient support to position the patient in an imaging region of the MRI scanner.

16. The MRI system according to claim 14, wherein performing the scout scan of the region of the patient comprises performing a single scout scan of the region of the patient.

17. The MRI system according to claim 14, wherein:
the scout scan has a lower resolution than a resolution of the MR measurement; and/or
the scout scan has a shorter duration than a duration of the MR measurement.

* * * * *